United States Patent [19]
Yano

[11] Patent Number: 5,210,696
[45] Date of Patent: May 11, 1993

[54] ELECTRON BEAM EXPOSURE DATA PROCESSING METHOD, ELECTRON BEAM EXPOSURE METHOD AND APPARATUS

[75] Inventor: Keiko Yano, Kawasaki, Japan

[73] Assignee: Fujitsu Limited, Kanagawa, Japan

[21] Appl. No.: 476,860

[22] Filed: Feb. 8, 1990

[30] Foreign Application Priority Data

Feb. 10, 1989 [JP] Japan .................................. 1-31563

[51] Int. Cl.⁵ ............................................. G06F 15/20
[52] U.S. Cl. .................................. 364/488; 250/492.2
[58] Field of Search ............... 364/488, 491, 200, 900; 250/492.1, 492.2

[56] References Cited

U.S. PATENT DOCUMENTS

| | | | |
|---|---|---|---|
| 4,132,898 | 1/1979 | Buelow et al. | 250/492.2 |
| 4,520,269 | 5/1985 | Jones | 430/296 X |
| 4,532,598 | 7/1985 | Shibayama et al. | 364/491 |
| 4,538,232 | 8/1985 | Koyama | 364/491 |
| 4,718,019 | 1/1988 | Fillion et al. | 364/491 |
| 4,812,962 | 3/1989 | Witt | 364/490 |
| 4,816,692 | 3/1989 | Rudert, Jr. | 364/491 X |
| 4,820,928 | 4/1989 | Ooyama et al. | 364/491 X |
| 4,878,177 | 10/1989 | Ikenaga et al. | 364/491 X |
| 4,951,216 | 8/1990 | Maluo | 364/490 |
| 5,086,398 | 2/1992 | Moriizumi | 250/398 X |
| 5,097,138 | 3/1992 | Wakabayashi et al. | 250/398 X |

FOREIGN PATENT DOCUMENTS

| | | |
|---|---|---|
| 110042 | 6/1984 | European Pat. Off. . |
| 55-103726 | 8/1980 | Japan . |
| 56-48136 | 5/1981 | Japan . |
| 57-45261 | 3/1982 | Japan . |
| 59-117214 | 6/1984 | Japan . |
| 59-167018 | 9/1984 | Japan . |
| 61-120168 | 1/1986 | Japan . |
| 62-133456 | 6/1987 | Japan . |

OTHER PUBLICATIONS

"Self-consistent Proximity Effect Correction Technique for Resist Exposure (SPECTRE)", M. Parikh, J. Vac. Sci. Technol., 15(3), pp. 931-943, May/Jun., 1978.
"Proximity Effect Correcting Method in Electron Beam Exposure", M. Suzuki, Jap. Appl. Phys., 29p--S-6, 1979.
"Proximity Correcting Method in Electron-Beam Lithography", N. Sugiyama, Jap. Appl. Phys., 4a-E-3, 1979.
"Corrections to Proximity Effects in Electron Beam Lithography", M. Parikh, J. Appl. Phys. 50(6), pp. 4371-4377, Jun., 1979.
"Control of Pattern Dimensions in Electron Lithography", H. Sewell, J. Vac. Sic. Technol., 15(3), pp. 927-930, May/Jun., 1978.
"Study of Correcting Intrapattern Proximity Effect to Negative Resist", Y. Machida, Jap. Appl. Phys., 3p-A-10, 1982.

(List continued on next page.)

Primary Examiner—Edward R. Cosimano
Attorney, Agent, or Firm—Nikaido, Marmelstein, Murray & Oram

[57] ABSTRACT

An electron beam exposure data processing method includes the steps of inputting exposure data relating to a pattern to be written, and determining whether or not the pattern should be subjected to a framing process. The method further includes performing the framing process when it is determined that the pattern should be subjected to the framing process so that the pattern is partitioned into a frame pattern and an inner pattern surrounded by the frame pattern, reducing the inner pattern by a reduction rate to thereby generate a reduced inner pattern, and determining an exposure dose for the frame pattern and an exposure dose for the reduced inner pattern. There are also provided an electron beam exposure method which employs the electron beam exposure data processing method and an apparatus implementing the same.

30 Claims, 11 Drawing Sheets

OTHER PUBLICATIONS

"Verification of Proximity Effect Correction Program in Electron-Beam Lithography", E. Kratschmer, J. Vac. Sci. Technol., 19(4), pp. 12640–1268, Nov./Dec. 1981.

"A Model for Optimizing CPU Time for Proximity Correction", W. W. Molzen et al, J. Vac. Sci. Technol., 19(4), pp. 1300–1303, Nov./Dec. 1981.

"Proximity Effect Correction Method (III) in Electron-beam Lithography", K. Kobayashi, Jap. Appl. Phys., 29p-S-7, 1979.

"Proximity Effect Correcting Method in Electron-beam Exposure", M. Suzuki et al, Jap. Appl. Phys., 4a-N-8, 1980.

"Submicron Pattern Proximity Correcting Method in Variably Shaped Electron Beam Exposure", M. Suzuki et al, Jap. Appl. Phys., 9p-G-16, 1981.

"Electron Beam Direct Writing Technology for LSI Wiring Process", S. Okazaki et al, Ins. of Elec. & Comm., No. 572, pp. 2-335, 1984.

"Framing Process in Electron Beam Lithography", M. Okumura et al, Jap. Appl. Phys., 20a-F-4, 1987.

"Technique For Automatic Subdivision of Pattern Data for Enhanced Proximity Effect Corrections", IBM Technical Disclosure Bulletin, vol. 21, No. 10, Mar. 1979, pp. 4278–4279.

ELECTRON BEAM EXPOSURE DATA PROCESSING METHOD, ELECTRON BEAM EXPOSURE METHOD AND APPARATUS

BACKGROUND OF THE INVENTION

The present invention generally relates to an electron beam exposure data processing method suitable for writing a pattern on a substrate such as a wafer, an electron beam resist or a reticle. The present invention is further concerned with an electron means exposure method and apparatus using the electron beam exposure data processing method.

As is well known, an electron beam exposure process is very effective to write a fine (submicron) pattern on a substrate. In electron beam lithography, the proximity effect occurs, which results from the fact that electrons are forward scattered and backscattered when they hit the substrate. The forward scattered or backscattered electrons expose the substrate so that an exposed pattern having dimensions greater than designed dimensions thereof is formed. In some cases, the forward scattered and/or backscattered electrons affect the exposure of an adjacent pattern. For the above-mentioned reasons, there is a need for correcting the proximity effect.

A conventional method of correcting the proximity effect in electron beam lithography includes steps of calculating the distance between a pattern of concern and each adjacent pattern and adjusting the exposure dose on the basis of the calculated distance (see M. Parikh, "SELF-CONSISTENT PROXIMITY EFFECT CORRECTION TECHNIQUE FOR RESIST EXPOSURE (SPECTRE)", J. Appl. Phys. 15(3), May/June 1978, pp. 931-934; M. Suzuki, "PROXIMITY EFFECT CORRECTING METHOD IN ELECTRON BEAM EXPOSURE", Jap. Appl. Phys., 29p-S-6, 1979; N. Sugiyama, "PROXIMITY CORRECTING METHOD IN ELECTRON-BEAM LITHOGRAPHY", Jap. Appl. Phys., 4a-E-3, 1979; Japanese Laid-Open Patent Application No. 56-48136 (1981); or Japanese Laid-Open Patent Application No. 56-48136 filed on May 1, 1981).

There is also known a different approach to proximity effect corrections (dimension corrections), which writes a pattern which is scaled down by a factor equal to an extended area due to the scattered electrons (see M. Parikh, "CORRECTIONS TO PROXIMITY EFFECTS IN ELECTRON BEAM LITHOGRAPHY", J. Appl. Phys. 50(6), June, 1979, pp. 4371-4377; or H. Sewell, J. Vac. Sci. Technol. 15(3), May/June 1978, pp. 927-930). Further, there is known a method of correcting both the dimensions and exposure dose (see, Y. Machida, "STUDY OF CORRECTING INTRAPATTERN PROXIMITY EFFECT TO NEGATIVE RESIST", Jap. Appl. Phys., 3p-A-10, 1982).

The conventional methods proposed in the above-mentioned papers precisely write patterns. However, it takes an extremely long time to refer to patterns adjacent to a pattern of interest and calculate adjusted dimensions of the pattern and/or an adjusted exposure dose for the pattern of interest.

Recently, various framing processes directed to proximity effect correction have been proposed (see E. Kratschmer, "VERIFICATION OF A PROXIMITY EFFECT CORRECTION PROGRAM IN ELECTRON-BEAM LITHOGRAPHY", J. Vac. Sci. Technol., 19(4), Nov./Dec. 1981, pp. 1264-1268; W. W al., "A MODEL FOR OPTIMIZING CPU TIME FOR PROXIMITY CORRECTION", J. Vac. Sci. Technol., 19(4), Nov./Dec. 1981, pp. 1300-1303; K. Kobayashi, "PROXIMITY EFFECT CORRECTING METHOD (III) IN ELECTRON-BEAM LITHOGRAPHY, Jap. Appl. Phys., 29p-S-7, 1979; M. Suzuki et al., "PROXIMITY EFFECT CORRECTING METHOD IN ELECTRON-BEAM EXPOSURE", Jap. Appl. Phys., 4a-N-8, 1980; M. Suzuki, et al., "SUBMICRON PATTERN PROXIMITY CORRECTING METHOD IN VARIABLY SHAPED ELECTRON BEAM EXPOSURE", Jap. Appl. Phys., 9p-G-16, 1981; S. Okazaki et al., "ELECTRON BEAM DIRECT WRITING TECHNOLOGY FOR LSI WIRING PROCESS", Ins. of Elec. & Comm., No. 572, 1984, pp. 2-335; M. Okumura et al., "FRAMING PROCESS IN ELECTRON BEAM LITHOGRAPHY", Jan. Appl. Phys., 20a-F-4, 1987; M. Okumura et al., "FRAMING PROCESS IN ELECTRON BEAM LITHOGRAPHY", Jan. Appl. Phys., 20a-F-5, 1987; Japanese Laid-Open Patent Application No. 61-12068 filed on Aug. 8, 1980 corresponding to U.S. Ser. No. 623262; Japanese Laid-Open Patent Application No. 57-45261 filed on May 15, 1982; Japanese Laid-Open Patent Application No. 59-167018 filed on Sep. 20, 1984; or U.S. Pat. No. 4,717,644). The proposed framing processes use shape (figure or pattern) partitioning, which is incorporated with dimension correction and/or dose correction. For example, a pattern to be written is divided into an outer frame and an inner frame. The outer frame is subjected to proximity effect correction, while the inner frame is provided with no correction.

SUMMARY OF THE INVENTION

An object of the present invention is to provide a novel method of processing exposure data so as to correct the proximity effect, which is distinguished from the conventional ones proposed in the aforementioned papers.

A more specific object of the present invention is to provide a method of processing exposure data so as to correct the proximity effect only by taking into consideration a pattern of interest itself without referring to an adjacent pattern so that it takes a reduced time to precisely write patterns on a substrate.

The above-mentioned objects of the present invention are achieved by an electron beam exposure data processing method comprising the steps of inputting exposure data relating to a pattern to be written; determining whether or not the pattern should be subjected to a framing process; performing the framing process when it is determined by the step that the pattern should be subjected to the framing process so that the pattern is partitioned into a frame pattern and an inner pattern surrounded by the frame pattern; reducing the inner pattern by a reduction rate to thereby generate a reduced inner pattern; and determining an exposure dose for the frame pattern and an exposure dose for the reduced inner pattern.

The above-mentioned objects of the present invention are also achieved by an electron beam exposure data processing method comprising the steps of inputting exposure data relating to a pattern to be written, a plurality of ranges of dimensions of pattern being predetermined; determining which one of the ranges of dimensions the pattern belongs to, a plurality of processing modes equal in number to the plurality of ranges of dimensions being provided, each of the plurality of processing modes defining a framing process by which the pattern is partitioned into a frame pattern and an inner pattern surrounded by the frame pattern, a reduction rate by which the pattern is reduced, a first exposure dose associated with the frame pattern, and a second exposure dose associated with the reduced inner pattern, the second exposure dose being less than the first exposure dose; and selecting one of the processing modes which corresponding to one of the ranges to which the pattern to be written belongs.

Another object of the present invention is to provide an electron beam exposure method using the above-mentioned method for processing exposure data.

This object of the present invention is achieved by an electron beam exposure method including the step of inputting exposure data relating to a pattern to be written; determining whether or not the pattern should be subjected to a framing process performing the framing process when it is determined that the pattern should be subjected to the framing process so that the pattern is partitioned into a frame pattern and an inner pattern surrounded by the frame pattern; reducing the inner pattern by a reduction rate to thereby generate a reduced inner pattern; determining an exposure dose for the frame pattern and an exposure dose for the reduced inner pattern; and projecting an electron beam onto an object to be exposed in accordance with the frame pattern, the reduced inner pattern, the exposure dose for the frame pattern and the exposure dose for the reduced inner pattern.

Yet another object of the present invention is to provide an electron beam exposure apparatus which executes the above-mentioned exposure method.

This object of the present invention is achieved by an electron beam exposure apparatus comprising a first device for inputting exposure data relating to a pattern to be written; a second device operatively coupled to the first device, for determining whether or not the pattern should be subjected to a framing process; and a third device operatively coupled to the first and second device, for performing the framing process when the second device determines that the pattern should be subjected to the framing process so that the pattern is partitioned into a frame pattern and an inner pattern surrounded by the frame pattern. The apparatus further comprises a fourth device operatively coupled to the first and third device, for reducing the inner pattern by a reduction rate to thereby generate a reduced inner pattern; a fifth device operatively coupled to the first and third device, for determining an exposure dose for the frame pattern and an exposure dose for the reduced inner pattern; and a sixth device operatively coupled to the third, fourth and fifth device, for projecting an electron beam onto an object to be exposed in accordance with the frame pattern, the reduced inner pattern, the exposure dose for the frame pattern and the exposure dose for the reduced inner pattern.

The above-mentioned object of the present invention is also achieved by an electron beam exposure apparatus comprising a first device for inputting exposure data relating to a pattern to be written, a plurality of ranges of dimensions of pattern being predetermined; a device operatively coupled to the first device, for determining which one of the ranges of dimensions the pattern belongs to, a plurality of processing modes equal in number to the plurality of ranges of dimensions being provided, each of the plurality of processing modes defining a framing process by which the pattern is partitioned into a frame pattern and an inner pattern surrounded by the frame pattern, a reduction rate by which the pattern is reduced, a first exposure dose associated with the frame pattern, and a second exposure dose associated with the reduced inner pattern, the second exposure, dose being less than the first exposure dose; and a third device operatively connected to the second device, for selecting one of the processing modes which corresponding to one of the ranges to which the pattern belongs.

Further objects, features and advantages of the present invention will become apparent from the following detailed description when read in conjunction with the accompanying drawings.

DESCRIPTION OF THE PREFERRED EMBODIMENTS

Figure 1:
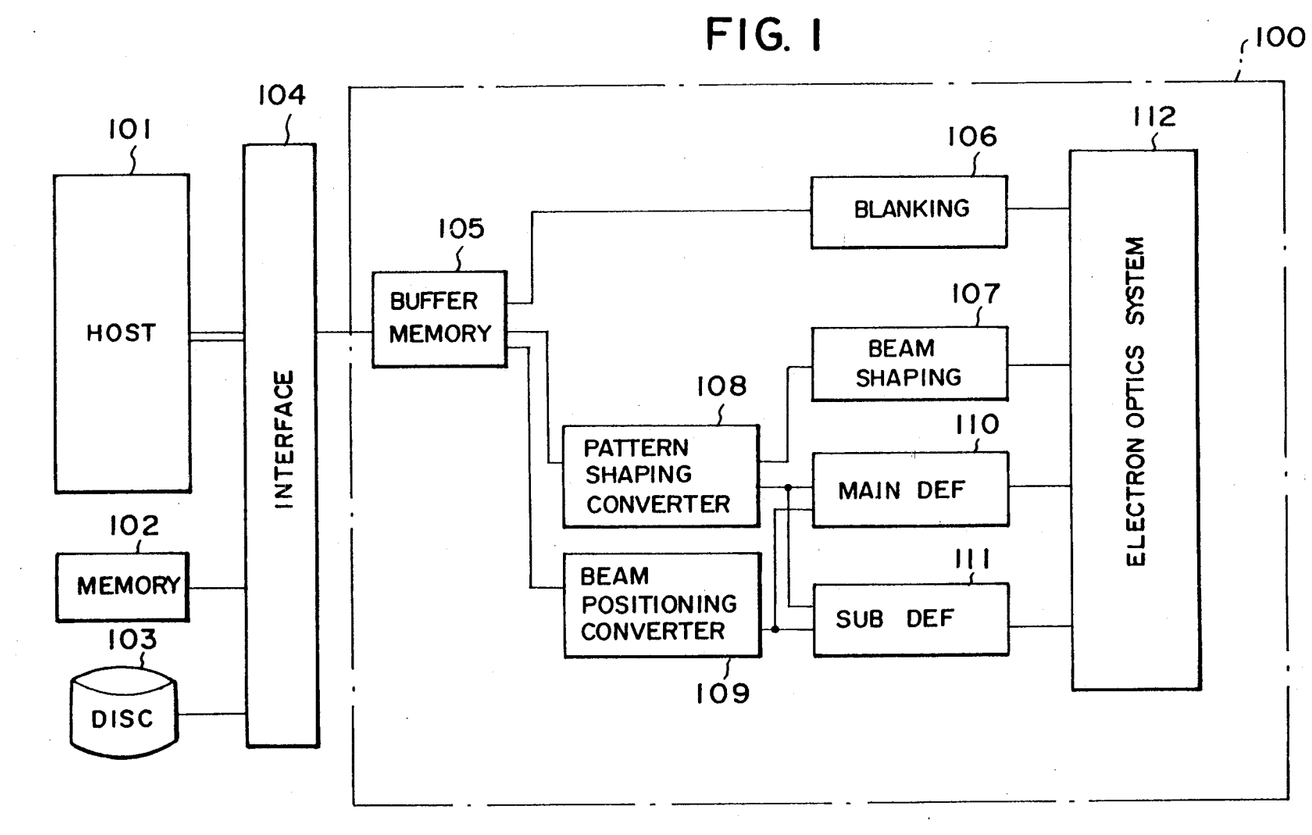
FIG. 1 is a block diagram of an electron beam exposure system according to the present invention.

Referring to FIG. 1, there is illustrated an electron beam exposure system, which includes an electron beam exposure apparatus 100 and a host computer 101 coupled thereto through an interface 104. A memory 102 and a memory disc device 103 are connected to the interface 104. The electron beam exposure apparatus includes a buffer memory 105, a blanking circuit 106, a beam shaping device 107, a pattern shaping converter 108, a beam positioning converter 109, a main deflector 110, a sub-deflector 111 and an electron optics system 112 including an electron gun (not shown).

Figure 2:
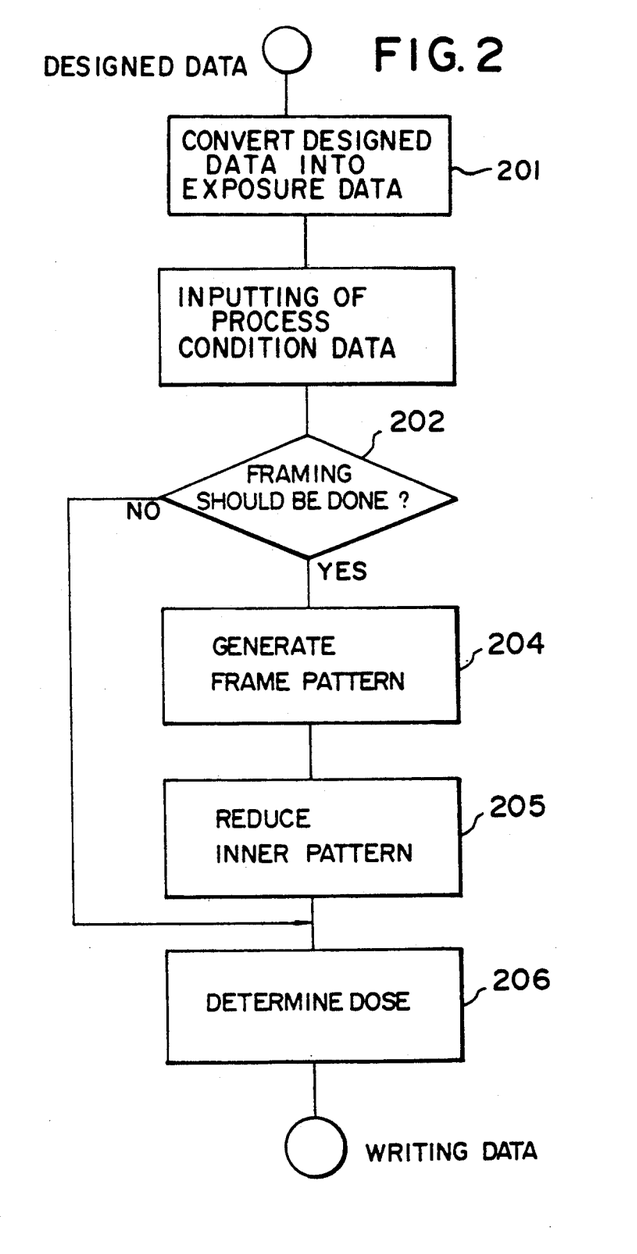
FIG. 2 is a flowchart of a process performed by a host computer shown in FIG. 1.

The host computer 101 executes control shown in FIG. 2. Referring to FIG. 2, at step 201, the host computer 101 converts designed data into electron beam exposure data (hereafter simply referred to as exposure data). Next, at step 202, the host computer 101 determines whether or not a framing process should be performed. Before executing step 202, at step 203, data relating to a process condition for steps 204 and 205 are input to the host computer 101 from the memory 102 and/or the disc device 103. Some of the process condition data is used for determining whether the framing process of step 202 should be performed. When the result of step 202 is YES, the control proceeds to step 204, which generates a frame pattern. At step 205, the host computer 101 scales down an inner pattern inside the frame pattern which is generated at step 204. Thereafter, the host computer 101 determines an exposure dose, step 206 for each of the frame pattern and the inner pattern so that writing data is generated. When the result of step 202 is NO, the control proceeds to step 206. In this case, steps 204 and 205 are not executed.

Figure 3A:
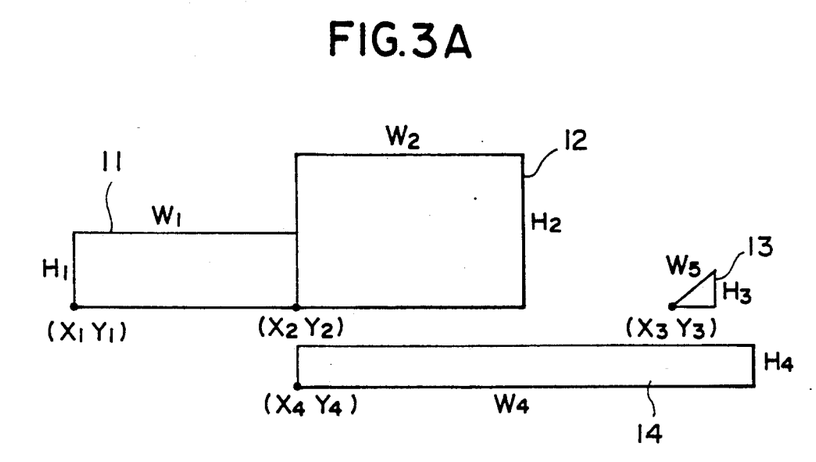
FIGS. 3A through 3D are diagrams illustrating a procedure for generating writing data to be supplied to an electron beam exposure apparatus shown in FIG. 1 according to a first preferred embodiment of the present invention.
Figure 4:
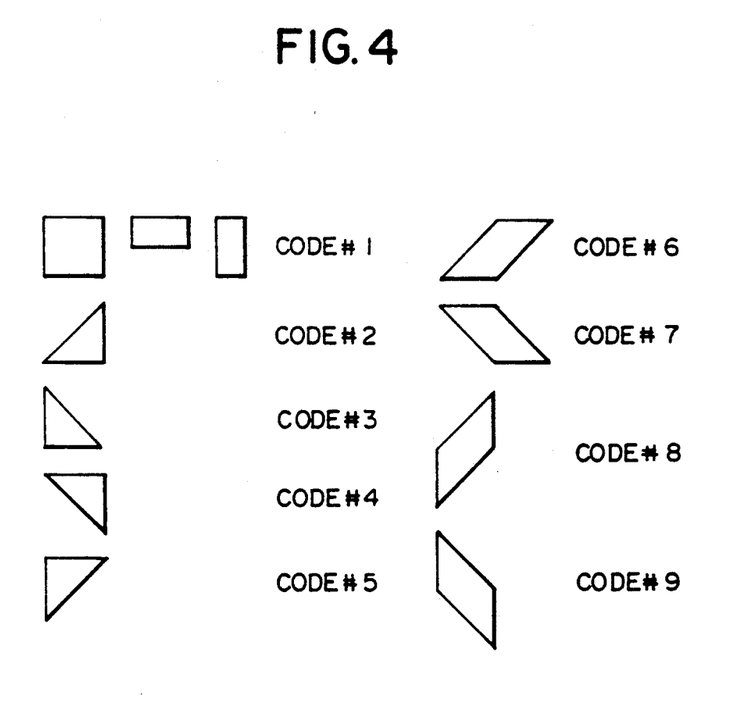
FIG. 4 is a diagram showing the relationship between pattern shapes and code numbers.

A description is given of a case where a designed pattern composed of four shapes 11, 12, 13 and 14 shown in FIG. 3A is written. Designed data relating to the design pattern is converted into exposure data, which contains information on a pattern shape (CODE), starting coordinates (X, Y), a pattern width (W), and a pattern height (length) (H). As shown in FIG. 4, predetermined pattern code numbers are given to individual pattern shapes. Code #1 is given to squares and rectangles, codes #2 through #5 are given to right-angled triangles and code #6 through #9 are given to parallelograms.

It is now assumed that the pattern shapes 11, 12, 13 and 14 are individually described by exposure data (pattern information) as shown in Table 1.

TABLE 1

| Shape | CODE | X | Y | W | H |
|---|---|---|---|---|---|
| 11 | #1 | $X_1$ | $Y_1$ | $W_1$ | $H_1$ |
| 12 | #1 | $X_2$ | $Y_2$ | $W_2$ | $H_2$ |
| 13 | #2 | $X_3$ | $Y_3$ | $W_3$ | $H_3$ |
| 14 | #1 | $X_4$ | $Y_4$ | $W_4$ | $H_4$ |

The process condition data to be input at step 203 (FIG. 2) includes a shape width minimum value Xmin, a shape height minimum value Ymin, a frame pattern width Lw, an inner pattern reducing rate Ds and an exposure factor De. The values of the process condition data are based on exposure circumstances, for example, relative to the type and thickness of resist, properties of wafer, the acceleration voltage and current density of the electron optics system 112 (FIG. 1) and so on. It is preferable that Xmin and Ymin be equal to or greater than 0.5 μm, and Lw is equal to or less than 1 μm. For example, Xmin=3.0 μm, Ymin =3.0 μm, Lw=0.7 μm and Ds=0.8. A preferable of the exposure factor De will be described later.

The host computer 101 executes the framing process when the following condition is satisfied:

*W>Xmin and H>Ymin.*

That is, the control proceeds to step 204 when the pattern width W is greater than the shape width minimum value Xmin and the pattern height Y is greater than the shape height minimum value Ymin. It is now assumed that only the shape 12 satisfies the above-mentioned determination condition. Thus, the shape 12 is subjected to the framing process at step 204 (FIG. 2).

Figure 3B:
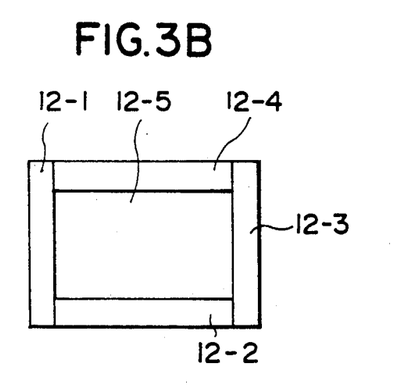

The framing process of step 204 divides the shape 12 into frame patterns 12-1 12-2, 12-3 and 12-4 and an inner pattern 12-5 (FIG. 3B). Pattern information (exposure data) relating to the frame patterns 12-1 to 12-4 and the inner pattern 12-5 is shown in Table 2.

TABLE 2

| Shape | CODE | X | Y | W | H |
|---|---|---|---|---|---|
| 12-1 | #1 | $X_{21}$ | $Y_{21}$ | Lw | $H_2$ |
| 12-2 | #1 | $X_{22}$ | $Y_{22}$ | $W_{22}$ | Lw |
| 12-3 | #1 | $X_{23}$ | $Y_{23}$ | Lw | $H_2$ |
| 12-4 | #1 | $X_{24}$ | $Y_{24}$ | $W_{24}$ | Lw |
| 12-5 | #1 | $X_{25}$ | $Y_{25}$ | $W_{25}$ | $H_{25}$ |

Figure 3C:
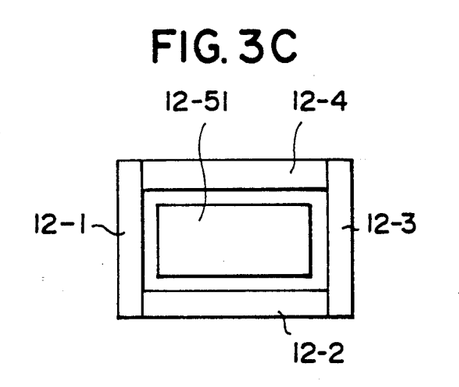
Figure 3D:
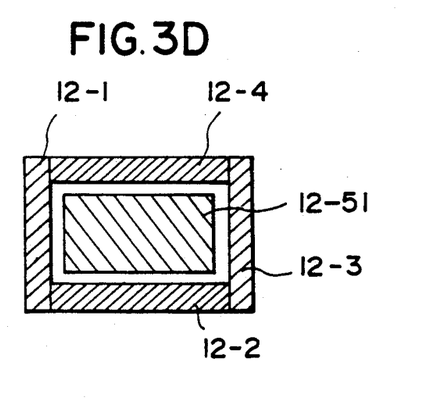

Then the control proceeds to step 205, which reduces the inner pattern 12-5 by the inner pattern reducing rate Ds and then generates a scaled-down inner pattern 12-51 shown in FIG. 3C. A value of the inner pattern reducing rate Ds is selected so that when the reduced inner pattern 12-51 and the frame patterns 12-1 to 12-4 are written, scattered electrons hit areas formed therebetween due to the proximity effect so that the reduced inner pattern 12-51 is contiguous to the frame patterns 12-1 to 12-4 in a real pattern after exposure FIG. 3D. That is, the areas serve as buffers. The reduced pattern 12-51 has pattern information represented by the following formulas:

$$X_{251} = X_{25} + (1 - Ds)W_{25}/2$$
$$Y_{251} = Y_{25} + (1 - Ds)H_{25}/2$$
$$W_{251} = W_{25} \times Ds$$
$$H_{251} = H_{25} \times Ds$$

where $X_{251}$ and $Y_{251}$ are the starting coordinates of the reduced inner pattern 12-51, $W_{25}$ and $H_{25}$ are the width and height thereof, respectively.

Then the control proceeds to step 206 (FIG. 2), which determines the exposure dose of each of the frame patterns 12-1 to 12-4 and the inner pattern 12-5. The exposure dose is obtained by multiplying the the exposure factor De to a basic exposure dose Dbase (C/cm²). When the basic exposure dose Dbase is 1, the exposure factor De relating to each of the frame patterns 12-1 through 12-4 is set equal to 1.0, and the exposure factor De relating to the reduced inner pattern 12-51 is set equal to or less than 1.0, for example, 0.6. Each of the shapes 11, 13 and 14 shown in FIG. 3A is not subjected to the framing process of step 202. The exposure factor De for each of the shapes 11, 13 and 14 is set equal to 1.2.

Writing data generated by the procedure shown in FIG. 2 is supplied to the buffer memory 105 through the interface 104 (FIG. 1). Then the electron beam exposure apparatus 100 emits electron beams and writes patterns on the substrate placed on a mask substrate in the same way as a conventional electron beam exposure apparatus.

Figure 5A:
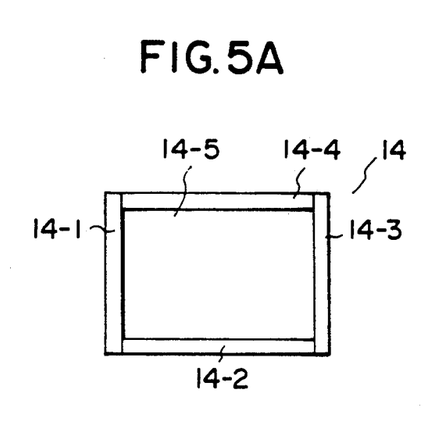
FIGS. 5A through 5E are diagrams illustrating a procedure for generating writing data according to a second preferred embodiment of the present invention.
Figure 5B:
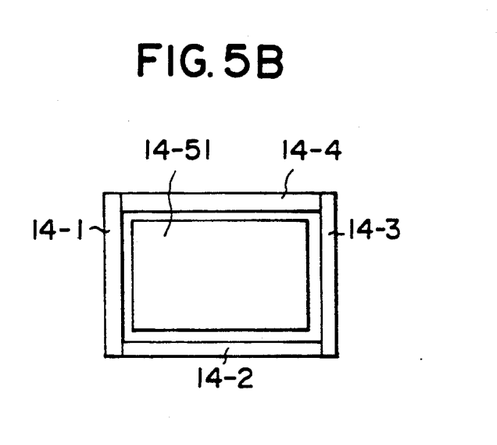
Figure 5C:
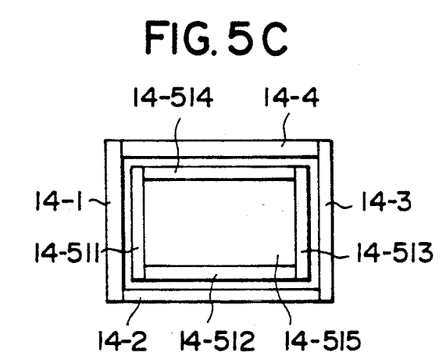
Figure 5D:
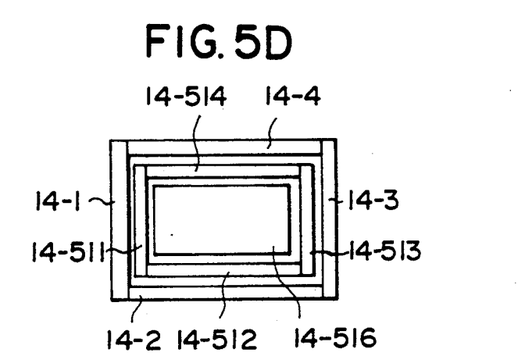
Figure 5E:
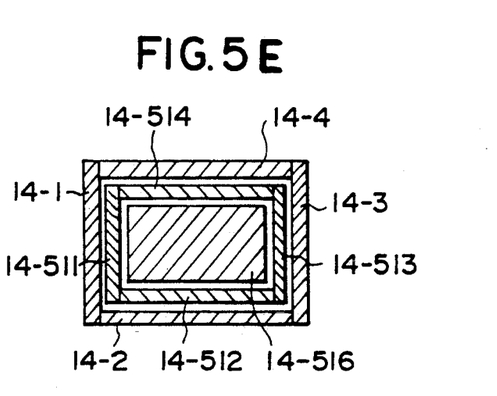

A description is given of a second preferred embodiment of the present invention with reference to FIGS. 5A through 5E. According to the second embodiment, a sequence of the framing process of step 202 (FIG. 2) and the inner pattern reducing process of step 205 is performed two times at step 204 shown in FIG. 2. Referring to FIG. 5A, a shape 14 is partitioned into frame patterns 14-1 through 14-4 and an inner pattern 14-5. As shown in FIG. 5B, the inner pattern 14-5 is reduced by the inner pattern reducing rate Ds so that a reduced inner pattern 14-51 is formed. As shown in FIG. 5C, the reduced inner pattern 14-51 is partitioned into frame patterns 14-511 through 14-514 and an inner pattern 14-515. This is done, for example, when the reduced inner pattern 14-51 satisfies W>Xmin and H>Ymin. As shown in FIG. 5D, the inner pattern 14-515 is reduced by the inner pattern reducing rate Ds so that a reduced inner pattern 14-516 is formed. The inner pattern reducing rate Ds for the reduced inner pattern 14-516 may be equal to or different from that for the reduced inner pattern 14-51. Then, the exposure dose for each of the patterns is calculated. In this case, the exposure factor De for the frame patterns 14-1 through 14-4 is set equal to 1.0, and the exposure factor De for the frame pattern 14-511 through 14-514 is set equal to 0.7. Further, the exposure factor De for the reduced inner pattern 14-516 is set equal to 0.5 (FIG. 5E).

The second embodiment is advantageous to a large shape. It is possible to execute the framing process three times or more. Alternatively, it is possible to divide a shape so that an area to be exposed and an area not to be exposed are alternately arranged into a mesh or a spiral.

Figure 6A:
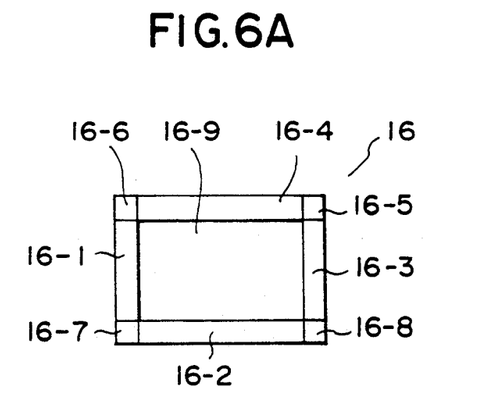
FIGS. 6A through 6C are diagrams illustrating a procedure for generating writing data according to a third preferred embodiment of the present invention.
Figure 6B:
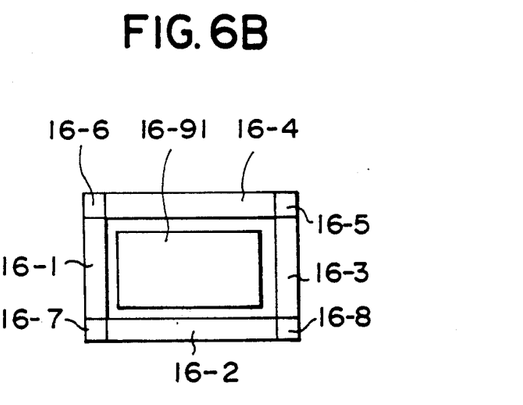
Figure 6C:
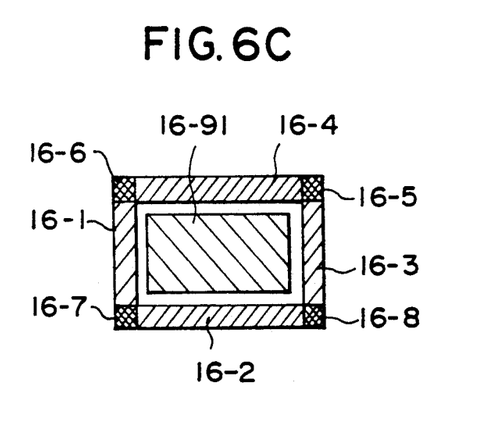

A description is given of a third preferred embodiment of the present invention with reference to FIGS. 6A through 6C. The third embodiment is characterized by having a process of giving a larger exposure dose to corner portions of frame patterns. Referring to FIG. 6A, a shape is partitioned into frame patterns 16-1 through 16-8 and an inner pattern 16-9. The frame patterns 16-1 through 16-4 correspond to side or intermediate portions of the shape 16, and the frame patterns 16-5 through 16-8 correspond to corner portions thereof. As shown in FIG. 6B, the inner pattern 16-9 is scaled down by the inner pattern reducing rate Ds so that a reduced inner pattern 16-91 is formed. As shown in FIG. 6C, the exposure factor De for each of the patterns is determined as follows. That is, the exposure factor De for each of the frame patterns 16-5 through 16-8 is set equal to 1.2, and the exposure factor De for each of the frame patterns 16-1 through 16-4 is set equal to 0.9. Further, the inner pattern reducing rate Ds for the reduced inner area 16-91 is set equal to 0.7.

It is noted that generally the exposure dose for the corner portions of the frame patterns is small, as compared with the other portions. According to the third embodiment, the corner portions are provided with an increased exposure dose and are thus written more definitely.

Figure 7A:
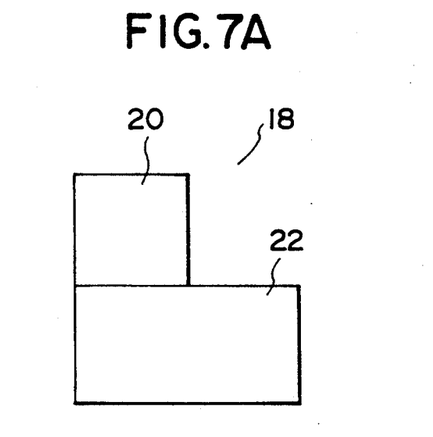
FIGS. 7A through 7D are diagrams illustrating a procedure for generating writing data according to a fourth preferred embodiment of the present invention.
Figure 7B:
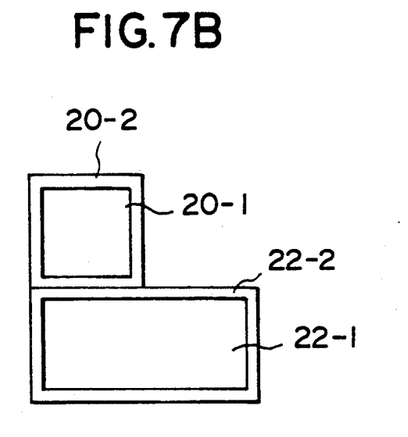
Figure 7C:
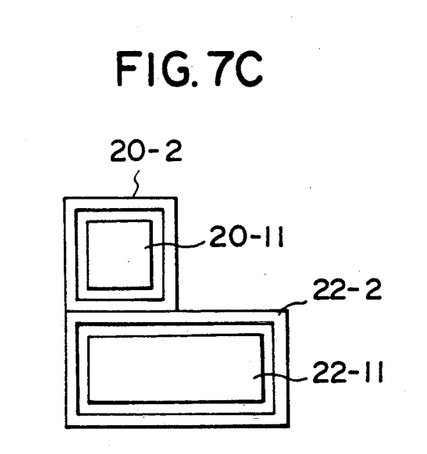
Figure 7D:
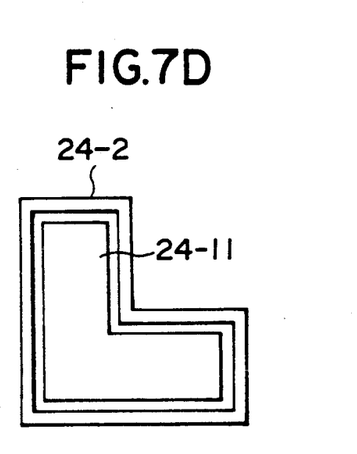

A description is given of a fourth preferred embodiment of the present invention with reference to FIGS. 7A through 7D. According to the fourth embodiment of the present invention, the frame pattern width Lw which is one of the processing condition parameters is set equal to a predetermined wiring rule so that a large shape is delineated. Referring to FIG. 7A, a designed pattern 18 consists of shapes 20 and 22, both of which need the framing process. As shown in FIG. 7B, the pattern 20 is partitioned into a frame pattern 20-2 and an inner pattern 20-1, and the pattern 22 is partitioned into a frame pattern 22-2 and an inner pattern 22-1. As shown in FIG. 7C, the inner pattern 20-1 is reduced by the inner pattern reducing factor Ds so that a reduced inner pattern 20-11 is formed. Similarly, the inner pattern 22-1 is reduced by the inner pattern reducing factor Ds so that a reduced inner pattern 22-11 is formed. Referring to FIG. 7D, a joint portion of the shapes 20 and 22 is processed so that the reduced inner pattern 20-11 is joined to the reduced inner pattern 22-11 to thereby form a unified reduced inner pattern 24-11 and a unified frame pattern 24-2. It has been confirmed that according to the first to fourth embodiments of the present invention, it is possible to reduce the processing time to one quarter of the processing time it takes to create writing data by conventional procedures.

Figure 8:
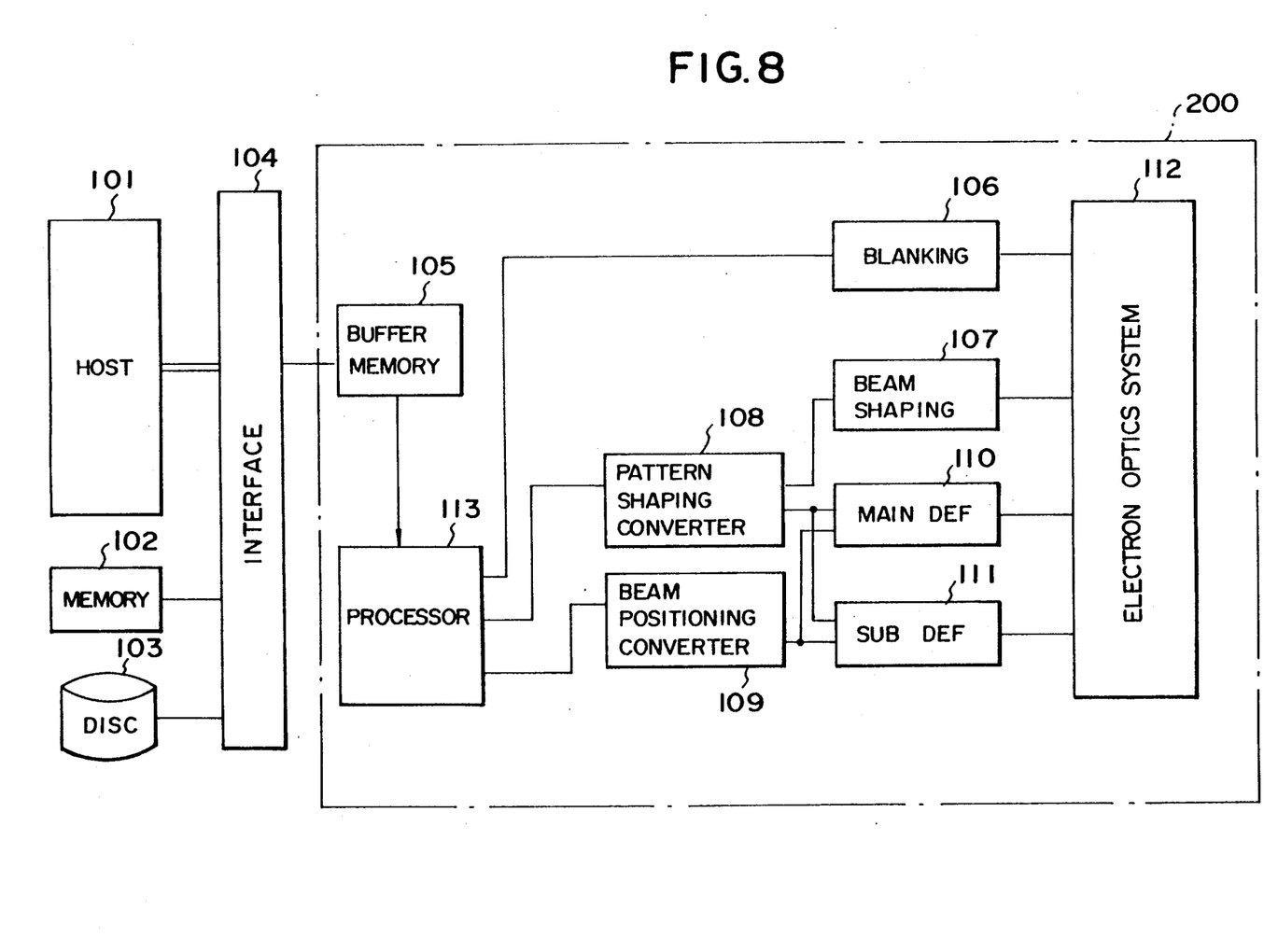
FIG. 8 is a block diagram of an electron beam exposure system according to a fifth preferred embodiment of the present invention.

A description is given of a fifth preferred embodiment of the present invention with reference to FIG. 8, in which those parts which are the same as those are given the same reference numerals. An electron beam exposure apparatus 200 includes a processor 113 in addition to the configuration shown in FIG. 1. The host computer 101 supplies designed data relating to a pattern with the electron beam exposure apparatus 200. That is, writing data to be supplied to the blanking circuit 106 and converters 108 and 109 is not created by the host computer 101 shown in FIG. 8 but is created by the processor 113 provided within the electron beam exposure apparatus 200.

Figure 9:
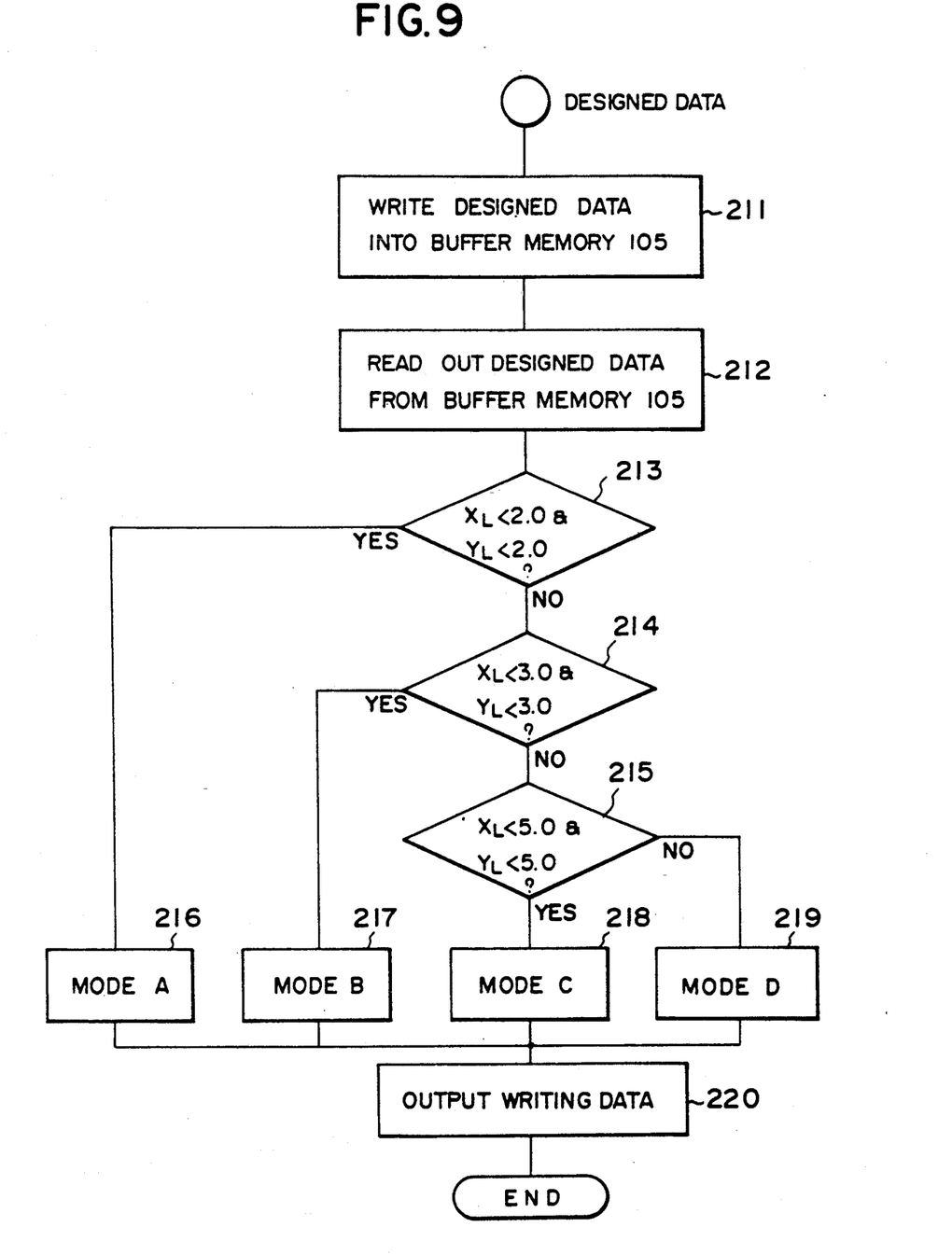
FIG. 9 is a flowchart of a procedure for generating writing data according to the fifth embodiment of the present invention.
Figure 10A:
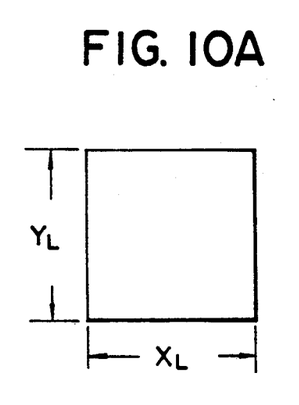
FIGS. 10A and 10B are diagrams showing the procedure according to the fifth embodiment of the present invention.

The processor 113 executes a control shown in FIG. 9. It is now considered that the processor 113 receives designed data relating to a shape shown in FIG. 10A having a width $X_L$ and a height $Y_L$. The processor 113 has four processing modes A, B, C and D, which depend on dimensions of shape. Table 3 represents the relationship between the processing modes A, B, C and D and dimensions X and $Y_L$. The numerals in Table 3 have a unit of micron (μm).

TABLE 3

|  | $X_L < 2.0$ | <3.0 | <5.0 | ≧5.0 |
|---|---|---|---|---|
| $Y_L < 2.0$ | A | B | C | C |
| $Y_L < 3.0$ | B | B | C | D |
| $Y_L < 5.0$ | C | C | D | D |
| $Y_L ≧ 5.0$ | C | D | D | D |

Table 4 shows the contents of the processing modes A, B, C and D.

TABLE 4

|  | Frame pattern | | Inner pattern | |
|---|---|---|---|---|
|  | To be framed | Width(μm) | Ds | De |
| Mode A | No | — | — | 1.2 |
| Mode B | Yes | 0.7 | 0.95 | 0.9 |
| Mode C | Yes | 0.7 | 0.90 | 0.85 |
| Mode D | Yes | 0.7 | 0.85 | 0.8 |

When the width $X_L$ and the height $Y_L$ of the shape are both less than 2.0 μm (mode A), the framing process is not performed and the exposure factor Ds equal to 1.2 is assigned to the shape. When the width $X_L$ or the height $Y_L$ is equal to 2.0 μm (mode B, C or D), the framing process is performed with the pattern width W set equal to 0.7 μm. In the modes B, C and D, the inner pattern reducing rate Ds is set equal to or less than 0.95, and the exposure factor De is set equal to or less than 0.9.

Referring to FIG. 9, designed data is transferred from the host computer 101 to the buffer memory 105 through the interface 104, and is then written therein (step 211). Then the designed data is read out from the buffer memory 105 and then supplied to the processor 113 (step 212). The processor 113 determines whether or not $X_L<2.0$ and $Y_L<2.0$ (step 213). When the result of step 213 is YES, the processor 113 selects the mode A (step 216). On the other hand, when the result of step 213 is NO, the control proceeds to step 214, at which the processor 113 determines whether or not $X_L<3.0$ and $Y_L<3.0$. When the result of step 214 is YES, the processor 113 selects the mode B at step 217. In contract, when the result of step 214 is NO, the control proceeds to step 215, at which the processor 113 determines whether or not $X<5.0$ and $Y_L<5.0$. When the result of step 215 is YES, the processor 113 selects the mode C at step 218. Adversely when the result of step 215 is NO, the processor 113 selects the mode D at step 219. Writing data created by the processor 113 is transferred to the blanking circuit 106, the pattern shaping converter 108 and the beam positioning converter 109 (step 220). The values at steps 213-215 are simply exemplified and any other values are selected.

Figure 10B:
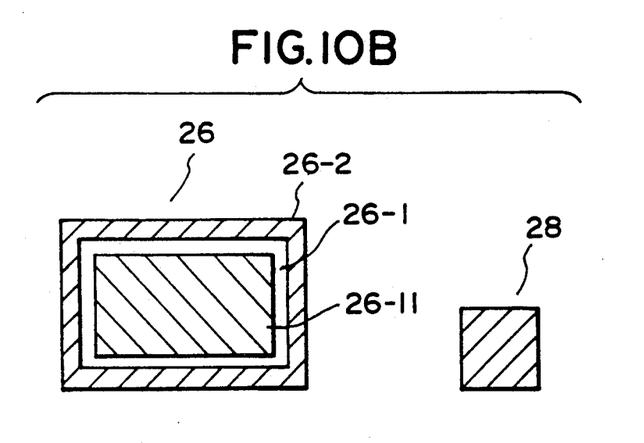

When a shape 26 shown in FIG. 10B has a width and a height each equal to or greater than 2.0 µm, one of the modes B, C and D is selected. When a shape 28 shown in FIG. 10B has a width and a height each less than 2.0 µm, the mode A is selected. In one of the modes B, C and D, the shape 26 shown in FIG. 10B is partitioned into a frame pattern 26-2 and an inner pattern 26-1. The inner pattern 26-1 is reduced by the inner pattern reducing factor Ds so that a reduced inner pattern 26-11 is formed. Then the exposure dose for each of the frame pattern 26-2 and the reduced inner pattern 26-11 are determined. On the other hand, the shape 28 shown in FIG. 10B is not subjected to the framing process, and is given the exposure factor De equal to 1.2.

It is noted that the processor 113 cannot handle as much data as processed by the host computer 101. For this reason, it is not practical to design the processor 113 to execute the aforementioned procedure shown in FIG. 2. Thus, it is very advantageous to providing for a predetermined number of different modes and selecting one of the modes depending on dimensions of pattern.

Figure 11:
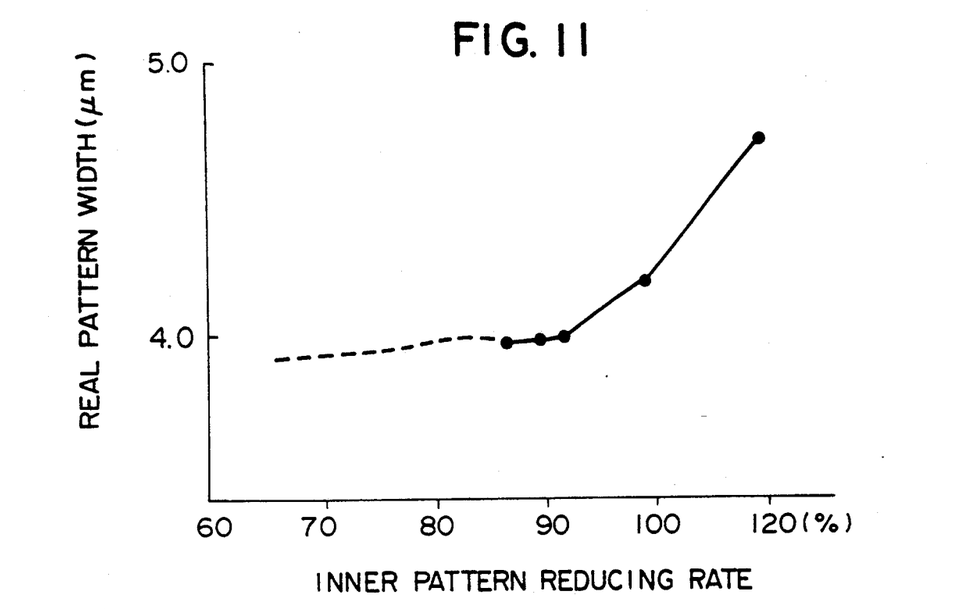
FIGS. 11 and 12 are graphs showing the experimental results.
Figure 12:
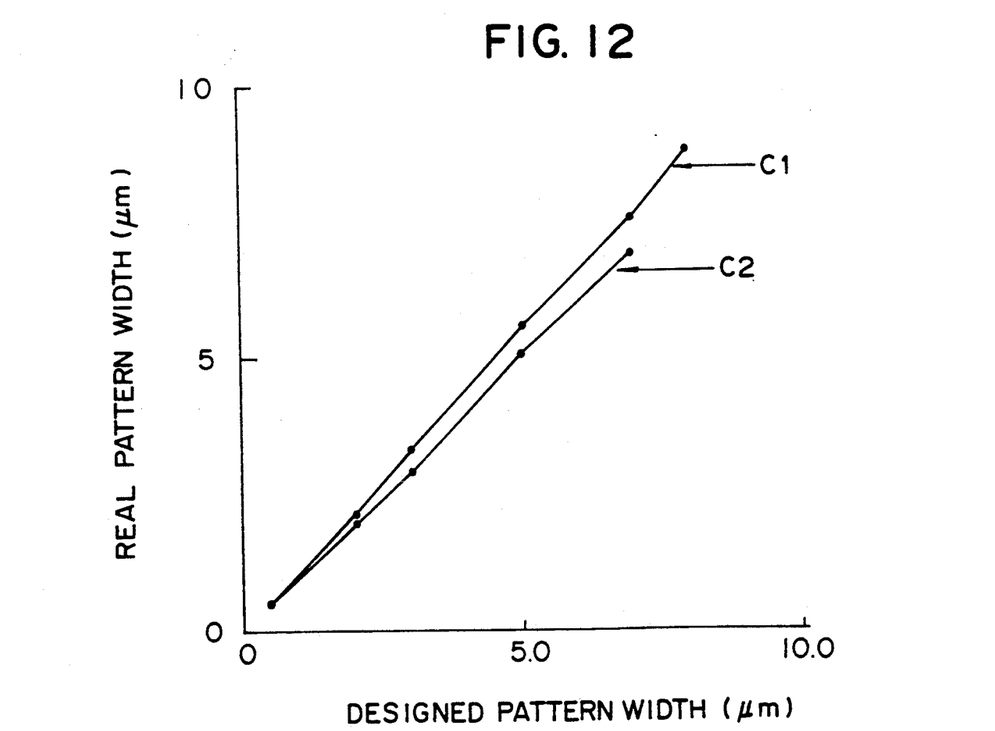

A description is given of the experimental results with reference to FIGS. 11 and 12. In the experiment conducted by the inventor, a line pattern having a width of 4.0 µm and a height of 10 µm was written by exposure. A frame pattern of the line pattern having a width of 0.5 µm was written by exposure. An inner pattern was reduced by a rate of 0.9. A negative electron-beam resist formed of CMS (chloromethyl styrene) having a thickness of 1.30 µm on a silicon substrate was used. The acceleration voltage was set equal to 30 kV. FIG. 11 is a graph illustrating the relationship between the real pattern width and the inner pattern reducing rate Ds. The graph of FIG. 11 shows that when the inner pattern reducing rate Ds is between 90% and 93%, a pattern width of 4.0 µm is obtained with a high precision.

In the experiment, line patterns having a width of 10 µm and a height (length) in the range of 0.5 µm to 10.0 µm were also written by exposure. Each line pattern was provided with a frame pattern having a width of 0.5 µm and was written by an exposure factor of 1. Table 5 shows the experimental results.

TABLE 5

|  | $L < 1.5$ | $L < 3.0$ | $L < 5.0$ | $L \geq 5.0$ |
|---|---|---|---|---|
| Framing | No | Yes | Yes | Yes |
| Ds | — | 95% | 93% | 89% |
| De | 0.98 | 0.95 | 0.9 | 0.87 |

Note that an exposure dose precisely defining a pattern width of 0.5 µm is set as the basic exposure dose. The exposure dose set when the framing process was not performed was set equal to the basic exposure dose.

FIG. 12 is a graph showing the relationship between the real pattern (line) width and the designed pattern width. In FIG. 12, a line C1 relates to the case where the framing process is not performed, and a line C2 relates to the case where the framing process is performed. It can be seen from the graph of FIG. 12 that the real pattern width is almost identical to the designed pattern width. On the other hand, there is a difference between the real pattern width and the designed pattern width when the framing process is not performed.

A description is given of an actual pattern writing process by the electron beam exposure system shown in FIG. 1 or FIG. 8. An almunium-silicon (Al-Si) substrate having a thickness of 6000 angstroms is used. A negative electron-beam resist of CMS is spin-coated on the substrate to a thickness of 1.3 µm. Next the resist on the substrate is pre-baked at 90° C. for 100 sec. Then, the resist is patterned by the electron beam exposure apparatus at an acceleration voltage of 30 kV and an exposure (electron) dose of $2\times10^{-5}$ C/cm². After that, the resist is developed by an organic solvent. Finally, the resist is post-baked at 100° C. for 100 sec.

Another pattern writing process is described. An silicon dioxide (SiO₂) substrate having a thickness of 6000 angstroms is used. A positive electron-beam resist of PMMA (polymethyl methacrylate) is spin-coated to a thickness of 1.4 µm. Next, the resist on the substrate is pre-baked at 170° C. for 100 sec. Then the resist is patterned by the electron beam exposure apparatus at an acceleration voltage of 20 kV and an exposure dose of $5\times10^{-5}$ C/cm². After that, the pattern is developed by an organic solvent. Finally, the pattern is post-baked at 80° C. for 100 sec.

The present invention is not limited to the specifically described embodiments, and variations and modifications may be made without departing from the scope of the present invention.

I claim:

1. An electron beam exposure data processing method comprising the steps of:
   a) inputting exposure data relating to a pattern to be written;
   b) determining whether or not said pattern should be subjected to a framing process;
   c) performing process when it is determined by the step b) that said pattern should be subjected to the framing process so that said pattern is positioned into a frame pattern and an inner pattern surrounded by said frame pattern;
   d) reducing said inner pattern by a reduction rate to generate a reduced inner pattern while not reducing said frame pattern, the reduction rate is increased with an increase in dimensions of said pattern; and
   e) determining an exposure dose for said frame pattern and an exposure dose for said reduced inner pattern.

2. An electron beam exposure data processing method as claimed in claim 1, wherein said reduction rate is determined so that when said reduced inner pattern and said frame pattern are written, an area between said reduced inner pattern and said frame pattern is written by a proximity effect.

3. An electron beam exposure data processing method as claimed in claim 1, wherein the exposure dose for said reduced inner pattern is equal to or less than the exposure dose for said frame pattern.

4. An electron beam exposure data processing method as claimed in claim 1, wherein the step (b) comprises the step of:

determining whether a width of said pattern is greater than a predetermined width;

determining whether a height of said pattern is greater than a predetermined height; and determining that said framing process should be performed when the width of said pattern is greater than the predetermined width and the height of said pattern is greater than the predetermined height.

5. An electron beam exposure data processing method as claimed in claim 1, further comprising the step of determining an exposure dose for said pattern without performing said framing process when the step (b) determines that said framing process should not be performed.

6. An electron beam exposure data processing method as claimed in claim 1, wherein the step (e) comprises the steps of:

determining a first exposure dose for corner portions of said frame pattern; and determining a second exposure dose for intermediate portions between said corner portions, said first exposure dose being greater than said second exposure dose.

7. An electron beam exposure data processing method as claimed in claim 1, wherein the reduction rate is increased with an increase in dimensions of said pattern.

8. An electron beam exposure data processing method as claimed in claim 1, further comprising the steps of:

reducing said reduced inner pattern by a second reduction rate to generate a second reduced inner pattern; and determining an exposure dose for said second reduced inner pattern.

9. An electron beam exposure data processing method as claimed in claim 8, wherein the exposure dose for said second reduced inner pattern is equal to or less than those for said frame pattern and said reduced inner pattern.

10. An electron beam exposure data processing method as claimed in claim 1, further comprising the steps of:

inputting an original pattern; and dividing said original pattern into sub-patterns each having a predetermined shape, each of said sub-patterns being said pattern to be written.

11. An electron beam exposure data processing method as claimed in claim 10, further comprising the steps of:

unifying frame patterns of said sub-patterns to generate a single unified frame pattern; and unifying inner patterns of said sub-patterns to generate a single unified frame pattern.

12. An electron beam exposure data processing method comprising the steps of:

a) inputting exposure data relating to a pattern to be written, a plurality of ranges of dimensions of pattern being predetermined;

b) determining which one of the ranges of dimensions said pattern belongs;

c) providing a plurality of processing modes equal in number to the plurality of ranges of dimensions, each of the plurality of processing modes defining a framing process by which said pattern is partitioned into 1) a frame pattern and 2) an inner pattern surrounded by said frame pattern;

d) selecting one of said process modes which correspond to one of the ranges to which said pattern to be written belongs;

e) reducing said inner pattern by a reduction rate while not reducing said frame pattern, the reduction rate is increased with an increase in dimensions of said pattern;

f) exposing said frame pattern to a first exposure dose; and g) exposing said reduced inner pattern to a second exposure dose which is less than said first exposure dose.

13. An electron beam exposure data processing method as claimed in claim 12, further comprising the steps of:

determining whether said pattern is greater than a predetermined size; and giving an exposure dose to said pattern without performing said framing process.

14. An electron beam exposure data processing method as claimed in claim 12, wherein said reduction rate is increased with an increase in dimensions of said pattern.

15. An electron beam exposure method comprising the steps of:

a) inputting exposure data relating to a pattern to be written;

b) determining whether or not said pattern should be subjected to a framing process;

c) performing said framing process when it is determined that said pattern should be subjected to the framing process so that said pattern is partitioned into a frame pattern and an inner frame pattern surrounded by said frame pattern;

d) reducing said inner pattern by a reduction rate to generate a reduced inner pattern while not reducing said frame pattern, the reduction rate is increased with an increase in dimensions of said pattern;

e) determining an exposure dose for said frame pattern and an exposure dose for said reduced inner pattern; and f) projecting an electron beam onto an object to be exposed in accordance with said frame pattern, said reduced inner pattern, said exposure dose for said frame pattern and said exposure dose for said reduced inner pattern.

16. An electron beam exposure method as claimed in claim 15, wherein said reduction rate is determined so that when said reduced inner pattern and said frame pattern are written, an area between said reduced inner pattern and said frame pattern is written by a proximity effect.

17. An electron beam exposure method as claimed in claim 15, wherein the exposure dose for said reduced inner pattern is equal to or less than the exposure dose for said frame pattern.

18. An electron beam exposure apparatus comprising:

first means for inputting exposure data relating to a pattern to be written;

second means operatively coupled to said first means, for determining whether or not said pattern should be subjected to a framing process;

third means operatively coupled to said first and second means, for performing said framing process when said second means determines that said pattern should be subjected to the framing process so that said pattern is partitioned into a frame pattern and an inner pattern surrounding by said frame pattern;

fourth means operatively coupled to said first and third means, for reducing said inner pattern by a reduction rate to generate a reduced inner pattern while not reducing said frame pattern, the reduction rate is increased with an increase in dimensions of said pattern;

fifth means operatively coupled to said first and third means, for determining an exposure dose for said frame pattern and an exposure dose for said reduced inner pattern; and sixth means operatively coupled to said third, fourth and fifth means, for projecting an electron beam onto an object to be exposed in accordance with said frame pattern, said reduced inner pattern, said exposure dose for said frame pattern and said exposure dose for said reduced inner pattern.

19. An electron beam exposure apparatus as claimed in claim 18, wherein said reduction rate is determined so that when said reduced inner pattern and said frame pattern are written, an area between said reduced inner pattern and said frame pattern is written by a proximity effect.

20. An electron beam exposure apparatus as claimed in claim 18, wherein the exposure dose for said reduced inner pattern is equal to or less than the exposure dose for said frame pattern.

21. An electron beam exposure apparatus as claimed in claim 18, wherein the second means comprises:
    means for determining whether a width of said pattern is greater than a predetermined width;
    means for determining whether a height of said pattern is greater than a predetermined height; and
    means for determining that said framing process should be performed when the width of said pattern is greater than the predetermined width and the height of said pattern is greater than the predetermined height.

22. An electron beam exposure apparatus as claimed in claim 18, further comprising means for determining an exposure dose for said pattern without performing said framing process when it is determined that said framing process should not be performed.

23. An electron beam exposure apparatus as claimed in claim 18, wherein said fifth means comprises:
    means for determining a first exposure dose for corner portions of said frame pattern; and
    means for determining a second exposure dose for intermediate portions between said corner portions,
    said first exposure dose being greater than said second exposure dose.

24. An electron beam exposure apparatus as claimed in claim 18, further comprising:

means for reducing said reduced inner pattern by a second reduction rate to generate a second reduced inner pattern; and means for determining an exposure dose for said second reduced inner pattern.

25. An electron beam exposure apparatus as claimed in claim 24, wherein the exposure dose for said second reduced inner pattern is equal to or less than those for said frame pattern and said reduced inner pattern.

26. An electron beam exposure apparatus as claimed in claim 18, further comprising:
    means for inputting an original pattern; and
    means for dividing said original pattern into sub-patterns each having a predetermined shape,
    each of said sub-patterns being said pattern to be written.

27. An electron beam exposure apparatus as claimed in claim 26, further comprising:
    means for unifying frame patterns of said sub-patterns to generate a single unified frame pattern; and
    means for unifying inner patterns of said sub-patterns to generate a single unified frame pattern.

28. An electron beam exposure apparatus comprising:
    first means for inputting exposure data relating to a pattern to be written, a plurality of ranges of dimensions of pattern being predetermined;
    means operatively coupled to said first means, for determining which one of the ranges of dimensions said pattern belongs, said means providing a plurality of processing modes equal in number to the plurality of ranges of dimensions, each of the plurality of processing modes defining a framing process by which said pattern is partitioned into a) a frame pattern and b) an inner pattern surrounded by said frame pattern, said means reducing said inner pattern by a reduction rate while not reducing said frame pattern, the reduction rate is increased with an increase in dimensions of said pattern, said means exposing said frame pattern to a first exposure dose, and exposing said reduced inner pattern to a second exposure dose, said second exposure dose being less than said first exposure dose; and
    third means operatively connected to said second means, for selecting one of said processing modes which correspond to one of the ranges to which said pattern belongs.

29. An electron beam exposure apparatus as claimed in claim 28, further comprising:
    means for determining whether said pattern is greater than a predetermined size; and
    means for giving an exposure dose to said pattern without performing said framing process.

30. An electron beam exposure apparatus as claimed in claim 28, wherein said reduction rate is increased with an increase in dimensions of said pattern.

* * * * *